(12) United States Patent
Maurer

(10) Patent No.: US 7,075,187 B1
(45) Date of Patent: Jul. 11, 2006

(54) COATING MATERIAL OVER ELECTRODES TO SUPPORT ORGANIC SYNTHESIS

(75) Inventor: Karl Maurer, Everett, WA (US)

(73) Assignee: CombiMatrix Corporation, Mukilteo, WA (US)

( * ) Notice: Subject to any disclaimer, the term of this patent is extended or adjusted under 35 U.S.C. 154(b) by 0 days.

(21) Appl. No.: 10/008,547

(22) Filed: Nov. 9, 2001

(51) Int. Cl.
*H01L 23/28* (2006.01)
*H01L 23/29* (2006.01)

(52) U.S. Cl. .................. 257/787; 257/632; 257/633; 257/634; 257/641; 257/642; 257/643; 257/644; 257/650; 257/788; 257/789; 257/790; 257/791; 257/792; 257/793; 257/794; 257/795; 257/796; 257/E21.273; 438/780; 438/958

(58) Field of Classification Search ........ 257/787–796, 257/710, 693, 700, 783, 260, 782, 632–634, 257/641–644, 650, E21.273; 438/780, 958
See application file for complete search history.

(56) References Cited

U.S. PATENT DOCUMENTS

| 3,890,417 | A | | 6/1975 | Vallance et al. | |
|---|---|---|---|---|---|
| 4,153,661 | A | * | 5/1979 | Ree et al. .................. | 264/120 |
| 4,373,519 | A | | 2/1983 | Errede et al. | |
| 4,460,642 | A | | 7/1984 | Errede et al. | |
| 4,565,663 | A | | 1/1986 | Errede et al. | |
| 4,971,736 | A | | 11/1990 | Hagen et al. | |
| 5,229,212 | A | * | 7/1993 | Reed .......................... | 428/429 |
| 5,498,761 | A | * | 3/1996 | Wessling et al. ............ | 427/542 |
| 5,601,979 | A | | 2/1997 | Wong | |
| 5,672,460 | A | * | 9/1997 | Katoh et al. ................. | 430/198 |
| 5,904,848 | A | | 5/1999 | Wong et al. | |
| 6,093,302 | A | | 7/2000 | Montgomery | |
| 6,150,103 | A | * | 11/2000 | Ness et al. ...................... | 435/6 |
| 6,245,508 | B1 | * | 6/2001 | Heller et al. .................. | 435/6 |
| 6,406,791 | B1 | * | 6/2002 | Dai et al. ..................... | 428/432 |
| 6,414,834 | B1 | * | 7/2002 | Weldon et al. ............... | 361/234 |
| 6,544,596 | B1 | * | 4/2003 | Clemens et al. .......... | 427/407.1 |
| 2001/0016361 | A1 | * | 8/2001 | Seul et al. ................... | 436/518 |
| 2001/0029017 | A1 | * | 10/2001 | Yasuda et al. ................. | 435/6 |
| 2001/0046762 | A1 | * | 11/2001 | Ito et al. ..................... | 438/589 |
| 2003/0050437 | A1 | * | 3/2003 | Montgomery ............... | 530/334 |
| 2004/0252163 | A1 | * | 12/2004 | Ellson et al. ................. | 347/46 |

* cited by examiner

*Primary Examiner*—Ida M. Soward
(74) *Attorney, Agent, or Firm*—Jeffrey B. Oster

(57) ABSTRACT

There is disclosed a coating material formulation for layering a plurality of electrodes to provide a substrate for the electrochemical synthesis of organic oligomers. Specifically, there is disclosed a coating layer of from about 0.5 to about 100 microns thick and is composed of a mixture of controlled porosity glass (CPG) particles having an average particle size of from about 0.25 to about 25 microns, and a thickening agent.

15 Claims, No Drawings

COATING MATERIAL OVER ELECTRODES TO SUPPORT ORGANIC SYNTHESIS

TECHNICAL FIELD OF THE INVENTION

The present invention provides a coating material formulation for layering a plurality of electrodes to provide a substrate for the electrochemical synthesis of organic oligomers. Specifically, the present invention provides a coating layer of from about 0.5 to about 100 microns thick and is composed of a mixture of controlled porosity glass (CPG) particles having an average particle size of from about 0.25 to about 25 microns, and a thickening agent.

BACKGROUND OF THE INVENTION

Conventional oligonucleotide synthesis entails first binding the protected 3' terminal nucleotide to a solid support by an ester linkage. The oligonucleotide is extended from the 3' end by the addition of an appropriate sequence of additional protected bases. In other words, the 3' end of a nucleotide is attached to the 5' end of the elongating oligonucleotide. This process yields an oligonucleotide bound to the support at its 3' end. The oligonucleotide is then deprotected, which results in cleavage from the support, and then purified.

U.S. Pat. No. 3,890,417 describes a method for making a porous diaphragm suitable for use in electrolytic cells. The diaphragm is formed as a sheet from aqueous polytetrafluoroethylene (PTFE) suspension and a solid, non-porous particle additive. Porosity is imparted to the product by removal of the particulate additive. U.S. Pat. No. 4,153,661 describes a similar method for making high tensile strength PTFE composite sheet material from aqueous PTFE suspension, and organic or inorganic particles which comprises mixing and calendering at an elevated temperature (50–100° C.) to produce a self-supporting film for use as an electronic insulator. U.S. Pat. Nos. 4,373,519; 4,460,642; 4,565,663 and 4,971,736 disclose methods for making water-swellable composite sheets having hydrophilic, absorptive particles enmeshed in the PTFE matrix for use as wound dressing and chromatographic supports.

In each instance for oligonucleotide synthesis, it is important to provide a substrate solid phase material that contains terminal OH groups available to start a coupling reaction and that each synthesis step for the coupling reaction to create an oligomer (i.e., deprotection and capping) goes to completion.

SUMMARY OF THE INVENTION

The present invention provides a coated semiconductor device having a plurality of electrodes embedded therein and exposed to an upper surface, and a coating layer coating the upper surface of the semiconductor device, wherein the coating layer is from about 0.5 to about 100 microns thick and is composed of a mixture of controlled porosity glass (CPG) particles having an average particle size of from about 0.25 to about 25 microns, and a thickening agent.

Preferably, the thickness of the coating layer is from about 1 to about 25 microns. Most preferably, the thickness of the coating layer is from about 3 to about 15 microns.

Preferably the thickening agent is selected from the group consisting of solid polymers of olefins such as polyethylene, polypropylene, polybutylene, polytetrafluoroethylene (PTFE), and polyvinyl difluoride; vinyl resins such as polyvinylchloride, polyacrylates, polyvinylacetate and polymethylmethacrylate; polycarbonates and polysulfones, optionally in combination with an acid selected from the group consisting of HCl, HBr, HI, $HNO_3$, $H_3PO_4$, $HClO_4$, acetic acid, sulfuric acid, organic acids (e.g., acetic acid, citric acid, malic acid, acids with the structure R—COOH, R—$SO_3H$, and R—$PO_3H_2$), nitric acid phosphoric acid, and combinations thereof. Most preferably the thickening agent is a resin, such as PTFE. More preferably, the PTFE particles are from about 0.005 to about 1.0 microns.

Preferably, the semiconductor device is made from silicon nitride and the electrodes are made from platinum.

The present invention further provides a formulation for coating a semiconductor device, wherein the semiconductor device comprises a plurality of electrodes, comprising a mixture of controlled porosity glass (CPG) particles having an average particle size of from about 0.25 to about 25 microns, and a thickening agent. Preferably, the thickness of the coating layer is from about 1 to about 25 microns. Most preferably, the thickness of the coating layer is from about 3 to about 15 microns.

Preferably the thickening agent is selected from the group consisting of solid polymers of olefins, such as polyethylene, polypropylene, polybutylene; polytetrafluoroethylene (PTFE), and polyvinylfluoride, vinyl resins such as polyvinylchloride, polyacrylates, polyvinylacetate and polymethylmethacrylate; polycarbonates and polysulfones, optionally in combination with an acid selected from the group consisting of HCl, HBr, HI, $HNO_3$, $H_3PO_4$, $HClO_4$, acetic acid, sulfuric acid, organic acids (e.g., acetic acid, citric acid, malic acid, acids with the structure R—COOH, R—$SO_3H$, and R—$PO_3H_2$), nitric acid phosphoric acid, and combinations thereof. More preferably, the PTFE particles are from about 0.005 to about 1.0 microns.

DETAILED DESCRIPTION OF THE INVENTION

The present invention provides a coated semiconductor device having a plurality of electrodes embedded therein and exposed to an upper surface, and a coating layer coating the upper surface of the semiconductor device, wherein the coating layer is from about 0.5 to about 100 microns thick and is composed of a mixture of inorganic porous material, such as controlled porosity glass (CPG) particles having an average particle size of from about 0.25 to about 25 microns, and a thickening agent. The present invention further provides a formulation for coating a semiconductor device, wherein the semiconductor device comprises a plurality of electrodes, comprising a mixture of controlled porosity glass (CPG) particles having an average particle size of from about 0.25 to about 25 microns, and a thickening agent.

The inventive coating material mixes an inorganic porous material (i.e., CPG) and a selected thickening agent in a dry or solid weight ratio of from 5% to 99%, preferably from 30% to 95% porous material. The thickening agent is preferably provided as a particulate suspension in water. DuPont T-30 60% PTFE suspended in water, particle size 0.005 to 0.5 microns is preferred. CPG is a preferred inorganic porous material. Preferred CPG has an average particle size of from about 0.25 to about 25 micron.

The coating material is preferably formed from a thick paste-like or pulp-like mixture of inorganic porous material, particulate synthetic resin (thickening agent) and water. The mixture is then formed on the semiconductor device by a process of dipping followed by drying or through a silk screening or stenciling technique. In a preferred coating procedure, CPG (controlled pore glass) having a particle size ground to 2–5 micron range with approximately 1000 Å pore size was weighed in a glass scintillation vial (150 mg) and water added (variable but often in the vicinity of 800 µl) to form a slurry. The slurry is sonicated until a homogeneous suspension is achieved (anywhere from 2 to 60 min with about 10 min providing optimal results). PTFE latex (Aldrich 44, 509–660% aqueous dispersion, 55 µl) is added and stirred (e.g., Pyrex coated stir bar) to form a suspended mixture. The suspended mixture is placed on a stir plate and allowed to stir (at 50 to 700 rpm) at a rate below which frothing occurs for a time from about 10 min to 24 hours. The result is a thickened suspension having a viscosity of from about 1 to about 10,000 cP and preferably from about 100 to about 1000 cP. The thickened suspension may be diluted with water to adjust viscosity. The thickened suspension is used to coat the surface of a microarray device. Once the device is coated with the thickened solution to form a coated surface, the surface is allowed to dry and then it is heated (oven) to enhance adhesion of PTFE to CPG particles and the surface of the electron-based semiconductor device. Oven temperatures for "baking" generally range from about 240 to about 400° C.

In addition, the slurry can be used to coat more than just semiconductor surfaces. For example, the slurry can be used to coat the inside of a reaction vessel, vial or wells of a microtiter plate and then derivatize the CPG particles. One example of such derivatization is by silanization to provide functional groups for the binding of biological moieties including cells and biomolecules. A general formula for the silicone compounds useful for silanization is: R—Si—X, wherein R represents an organic moiety with a terminal functional group such as an amino, hydroxyl, epoxy, aldehyde, sulfhydryl, phenyl, long chain alkyl or other group that will chemically react or physically absorb with the biological molecules and X may be a mono-, di- or trialkoxy or halide group which will react with the silanol groups on the surface of the inorganic material. The degree of silanization can be demonstrated through quantitative analysis of the respective functional groups. One example is treatment with trialkoxyaminopropyl silane to provide an amine functional group useful as a substrate to bind peptides or in situ peptide synthesis.

Another is treatment with a glycosyl derivative followed by an acid, to incorporate an alkyl tethered hydroxyl terminated linker on which various sugars can be assembled through iterative rounds of deprotection and monomer coupling.

EXAMPLE 1

This example illustrates the coating of a semiconductor device or "chip" having a plurality of electrodes wherein the electrodes cause an electrochemical reaction to regionally alter the pH of a solution covering the coated chip. Briefly, an aliquot (~750 micro liters) of thickened fluid CPG/Teflon (PTFE) mixture is placed in a microcentrifuge tube and an electrode-containing semiconductor device is slowly dipped into and removed from the fluid to give a coated semiconductor device. This part is allowed to dry for 1 hour at room temperature and is then heated using a stepped temperature ramp of 10 min at 100° C., 10 min at 200° C., 10 min at 300° C. and 30 min at 340° C. It should be noted that both much faster and much slower temperature ramps can be expected to work for this procedure as well as some variation in final heating temperature. The oven is allowed to cool to ambient temperature over 3 hours and any excess CPG/Teflon material is removed using a swab.

EXAMPLE 2

This example illustrates a process for coating a reaction vessel: An aliquot of thickened fluid CPG/Teflon mixture is placed in the vessel to be coated and rolled and tipped to produce a coating of the desired thickness. The vessel is then dried and subjected to a heating process as described in Example 1.

EXAMPLE 3

This example illustrates a process for coating a microtiter plate. A heat-resistant microtiter plate is filled with thickened fluid CPG/Teflon mixture than slowly inverted to give a plate with all wells coated. After drying and heating as described for example 1, excess material is removed with a swab to give a microtiter plate with a discreet porous coating in each well.

I claim:

1. A coated semiconductor device having a plurality of electrodes embedded therein and exposed to an upper surface, and a coating layer coating the upper surface of the semiconductor device, wherein the coating layer is from about 0.5 to about 100 microns thick and is composed of a mixture of controlled porosity glass (CPG) particles having an average particle size of from about 0.25 to about 25 microns, and a thickening agent, wherein the coating layer adheres to the upper surface of the semiconductor device, wherein the thickening agent is selected from the group consisting of solid polymers of olefins, polyethylene, polyvinyl difluoride, polypropylene and polybutylene; vinyl resins, polytetrafluoroethylene (PTFE), polyvinylchloride, polyacrylates, polyvinylacetate and polymethylmethacrylate; polycarbonates and polysulfones.

2. The coated semiconductor device of claim 1 wherein the thickness of the coating layer is from about 1 to about 25 microns.

3. The coated semiconductor device of claim 2 wherein the thickness of the coating layer is from about 3 to about 15 microns.

4. The coated semiconductor device of claim 1 wherein the thickening agent further comprises acid selected from the group consisting of HCl, HBr, HI, $HNO_3$, $H_3PO_4$, $HClO_4$, acetic acid, sulfuric acid, organic acids, acetic acid, citric acid, malic acid, acids with the structure R—COOH, R—$SO_3H$, and R—$PO_3H_2$, nitric acid, phosphoric acid, and combinations thereof.

5. The coated semiconductor device of claim 4 wherein the thickening agent is a resin.

6. The coated semiconductor device of claim 5 wherein the thickening agent is PTFE in particle form or in aqueous suspension.

7. The coated semiconductor device of claim 6 wherein the PTFE particles are from about 0.005 to about 1.0 microns.

8. The coated semiconductor device of claim 1 wherein the semiconductor device is made from silicon nitride and the electrodes are made from platinum.

9. A formulation for coating and adhering to a semiconductor device, wherein the semiconductor device comprises a plurality of electrodes, comprising a mixture of controlled porosity glass (CPG) particles having an average particle size of from about 0.25 to about 25 microns, and a thickening agent, wherein the thickening agent is selected from the group consisting of solid polymers of olefins, polyethylene polyvinyl difluoride, polypropylene and polybutylene; vinyl resins, polytetrafluroethylene (PTFE), polyvinylchloride polyacrylates, polyvinylacetate and polymethylmethacrylate; polycarbonates and polysulfones.

10. The formulation for coating and adhering to a semiconductor device of claim 9, wherein the thickness of the coating layer is from about 1 to about 25 microns.

11. The formulation for coating and adhering to a semiconductor device of claim 10, wherein the thickness of the coating layer is from about 3 to about 15 microns.

12. The formulation for coating and adhering to a semiconductor device of claim 9, wherein the thickening agent further comprises an acid selected from the group consisting of HCl, HBr, HI, $HNO_3$, $H_3PO_4$, $HClO_4$, acetic acid, sulfuric acid, organic acids, acetic acid, citric acid, malic acid, acids with the structure R—COOH, R—$SO_3H$, and R—$PO_3H_2$, nitric acid, phosphoric acid, and combinations thereof.

13. The formulation for coating and adhering to a semiconductor device of claim 9, wherein the thickening agent is a resin.

14. The formulation for coating and adhering to a semiconductor device of claim 9, wherein the thickening agent is PTFE in particle form or in aqueous suspension.

15. The formulation for coating and adhering to a semiconductor device of claim 9, wherein the PTFE particles are from about 0.005 to about 1.0 microns.

\* \* \* \* \*

US007075187C1

(12) EX PARTE REEXAMINATION CERTIFICATE (6128th)

United States Patent
Maurer

(10) Number: US 7,075,187 C1
(45) Certificate Issued: Feb. 19, 2008

(54) COATING MATERIAL OVER ELECTRODES TO SUPPORT ORGANIC SYNTHESIS

(75) Inventor: Karl Maurer, Everett, WA (US)

(73) Assignee: CombiMatrix Corporation, Mukilteo, WA (US)

Reexamination Request:
No. 90/008,472, Jan. 26, 2007

Reexamination Certificate for:
Patent No.: 7,075,187
Issued: Jul. 11, 2006
Appl. No.: 10/008,547
Filed: Nov. 9, 2001

(51) Int. Cl.
*H01L 23/28* (2006.01)
*H01L 23/29* (2006.01)

(52) U.S. Cl. .............. 257/787; 257/632; 257/633; 257/634; 257/641; 257/642; 257/643; 257/644; 257/650; 257/788; 257/789; 257/790; 257/791; 257/792; 257/793; 257/794; 257/795; 257/796; 257/E21.273; 257/E23.119; 257/E23.132; 438/780; 438/958

(58) Field of Classification Search ................ None
See application file for complete search history.

(56) References Cited

U.S. PATENT DOCUMENTS 6,303,316 B1    10/2001   Kiel et al. ................ 435/6
2003/0059540 A1  3/2003   Berni et al. ............ 427/376.1

*Primary Examiner*—Dwayne C. Jones

(57) ABSTRACT

There is disclosed a coating material formulation for layering a plurality of electrodes to provide a substrate for the electrochemical synthesis of organic oligomers. Specifically, there is disclosed a coating layer of from about 0.5 to about 100 microns thick and is composed of a mixture of controlled porosity glass (CPG) particles having an average particle size of from about 0.25 to about 25 microns, and a thickening agent.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–15 is confirmed.

* * * * *